(12) United States Patent
Kawaguchi et al.

(10) Patent No.: US 8,105,673 B2
(45) Date of Patent: Jan. 31, 2012

(54) SPUTTERING TARGET FOR OPTICAL MEDIA, METHOD OF MANUFACTURING SAME, OPTICAL MEDIUM, AND METHOD OF MANUFACTURING SAME

(75) Inventors: Yukio Kawaguchi, Tokyo (JP); Isamu Kuribayashi, Tokyo (JP)

(73) Assignee: TDK Corporation, Tokyo (JP)

( * ) Notice: Subject to any disclaimer, the term of this patent is extended or adjusted under 35 U.S.C. 154(b) by 329 days.

(21) Appl. No.: 12/555,349

(22) Filed: Sep. 8, 2009

(65) Prior Publication Data

US 2010/0075099 A1 Mar. 25, 2010

(30) Foreign Application Priority Data

Sep. 22, 2008 (JP) .............................. P2008-242829
Jun. 2, 2009 (JP) .............................. P2009-133409

(51) Int. Cl.
*B32B 3/02* (2006.01)
(52) U.S. Cl. .................. 428/64.1; 428/64.4; 430/270.12
(58) Field of Classification Search .................. 428/64.4; 430/270.12
See application file for complete search history.

(56) References Cited

U.S. PATENT DOCUMENTS

| 6,689,444 | B2 | 2/2004 | Nakai et al. |
| 6,929,840 | B2 | 8/2005 | Hosoda et al. |
| 7,622,809 | B2 | 11/2009 | Gotoh et al. |
| 2009/0176113 | A1 | 7/2009 | Gotoh et al. |

FOREIGN PATENT DOCUMENTS

| CN | 1234580 A | 11/1999 |
| JP | A-4-26757 | 1/1992 |
| JP | A-4-99171 | 3/1992 |
| JP | A-4-186538 | 7/1992 |
| JP | A-2002-15464 | 1/2002 |
| JP | A-2004-171631 | 6/2004 |
| JP | B2-3545787 | 7/2004 |
| JP | A-2004-284241 | 10/2004 |
| JP | A-2006-261636 | 9/2006 |
| JP | A-2007-92153 | 4/2007 |

OTHER PUBLICATIONS

Lijun, W. et al., "Aluminum Alloy Film Used for Optical Recording Media and Sputtering Target Therefore," *Rare Metals*, Sep. 1997, pp. 379-383, vol. 21, No. 5.
Chinese Office Action issued in Chinese Application No. 200910205799.7 on Jul. 13, 2011.
Japanese Office Action issued in Japanese Patent Application No. 2009-133409 dated Aug. 3, 2010.

*Primary Examiner* — Elizabeth Mulvaney
(74) *Attorney, Agent, or Firm* — Oliff & Berridge, PLC

(57) ABSTRACT

A sputtering target for optical media is mainly composed of Al and contains 1 to 10 at % of one or two species of elements selected from the group consisting of Ta and Nb and 0.1 to 10 at % of Ag. An optical medium 100 comprises a substrate 10 and reflective layers 20A, 20B provided on the substrate 10. Each of the reflective layers 20A, 20B has a composition, mainly composed of Al, containing 1 to 10 at % of one or two species of elements selected from the group consisting of Ta and Nb and 0.1 to 10 at % of Ag.

9 Claims, 4 Drawing Sheets

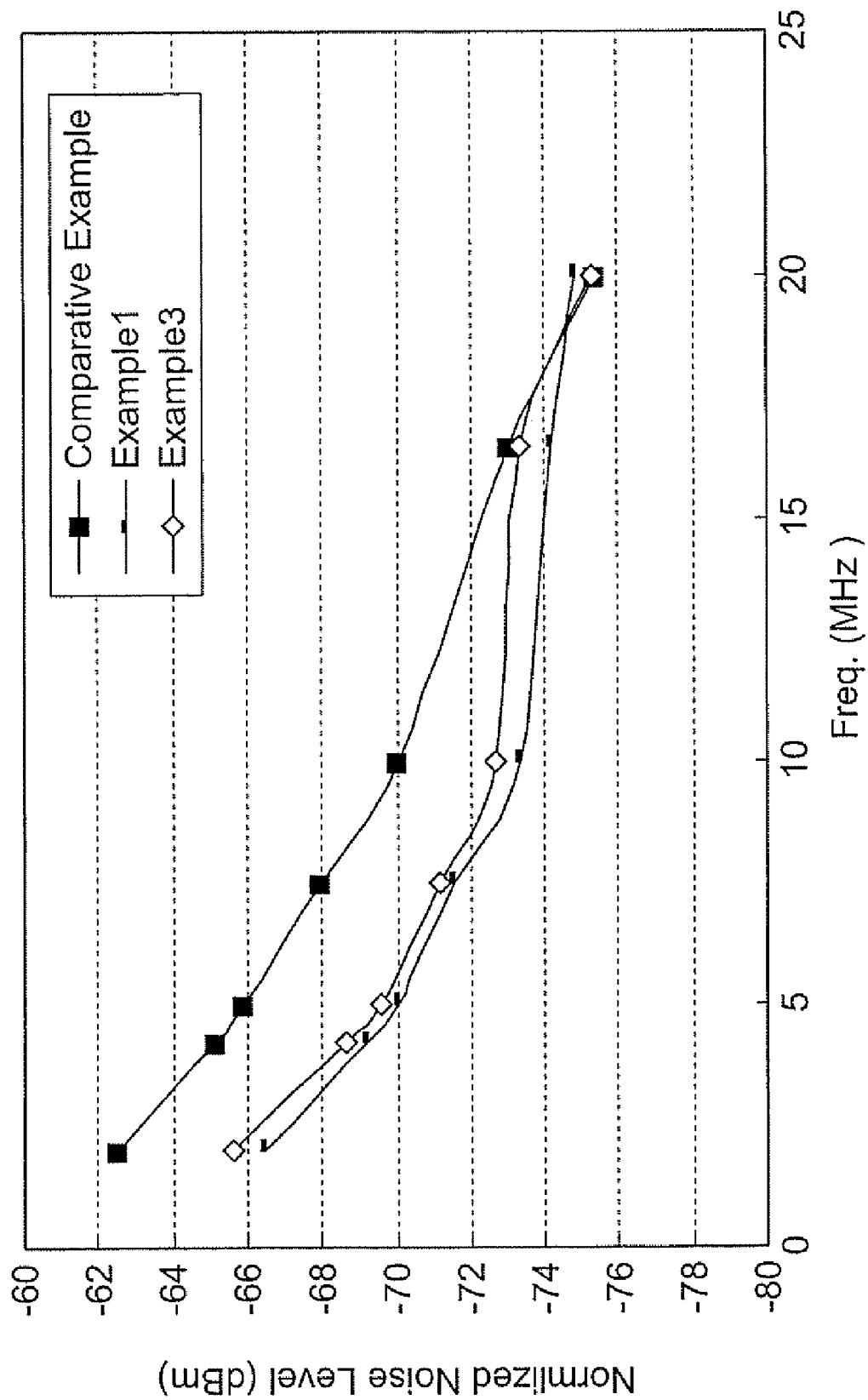

SPUTTERING TARGET FOR OPTICAL MEDIA, METHOD OF MANUFACTURING SAME, OPTICAL MEDIUM, AND METHOD OF MANUFACTURING SAME

BACKGROUND OF THE INVENTION

1. Field of the Invention

The present invention relates to a sputtering target for optical media such as optical discs, a method of manufacturing the same, an optical medium, and a method of manufacturing the same.

2. Related Background Art

Optical media such as optical discs (e.g., BD (blu-ray disc)-ROM, BD-R, and BD-RE) and optical cards have been known, which are manufactured by forming a reflective layer on a substrate by sputtering with a sputtering target and further forming an optical recording layer, a transparent cover layer through which light is transmitted at the time of reading and writing, and the like on the reflective layer. When the surface smoothness of the reflective layer on the sputtered film-deposition end surface side is not high in such an optical medium, favorable reflections may not be obtained upon irradiation with laser beams, so that structures of the optical recording layer, transparent cover layer, and the like may be affected adversely, whereby characteristics such as noise characteristics, for example, may deteriorate. The deterioration in characteristics such as noise characteristics is remarkable in particular in optical media having a recording layer which is constituted by first and second inorganic reaction layers and carries out recording by mixing the first and second inorganic reaction layers upon irradiation with a laser beam.

As a sputtering target suitable for manufacturing reflective layers for optical media, Japanese Patent Application Laid-Open Nos. 4-099171 and 4-026757 disclose Al and Al alloys mainly composed of Al. Japanese Patent Application Laid-Open No. 2002-015464 discloses a sputtering target and optical media using silver with high thermal conductivity or a silver alloy mainly composed of silver. Japanese Patent Application Laid-Open No. 2004-171631 discloses an optical medium equipped with a reflective film, mainly composed of Al, having high smoothness.

SUMMARY OF THE INVENTION

However, the Al alloys mainly composed of Al used in the conventional optical media have not attained sufficient surface smoothness on the film-deposition end surface side of the reflective layer, while silver is an expensive metal, so that reflective layers made of or mainly composed of silver are not favorable, and the amount of silver is desired to be as small as possible.

In view of the problems mentioned above, it is an object of the present invention to provide an inexpensive sputtering target for optical media which is mainly composed of relatively inexpensive aluminum and excellent in surface smoothness, a method of manufacturing the same, an optical medium, and a method of manufacturing the same.

As a result of diligent studies, the inventors have found that a reflective layer formed by using a sputtering target which is mainly composed of Al and contains 1 to 10 at % of one or two species of elements selected from the group consisting of Ta and Nb and 0.1 to 10 at % of Ag is excellent in surface smoothness.

A sputtering target for optical media in accordance with the present invention has a composition which is mainly composed of Al and contains 1 to 10 at % of one or two species of elements selected from the group consisting of Ta and Nb and 0.1 to 10 at % of Ag.

A optical medium in accordance with the present invention comprises a substrate, and a reflective layer provided on the substrate, the reflective layer having a composition which is mainly composed of Al and contains 1 to 10 at % of one or two species of elements selected from the group consisting of Ta and Nb and 0.1 to 10 at % of Ag.

A method of manufacturing an optical medium in accordance with the present invention comprises a step of forming a reflective layer by using a sputtering target being mainly composed of Al and containing 1 to 10 at % of one or two species of elements selected from the group consisting of Ta and Nb and 0.1 to 10 at % of Ag.

A method of manufacturing a sputtering target for optical media in accordance with the present invention comprises a step of firing a material powder having a composition which is mainly composed of Al and contains 1 to 10 at % of one or two species of elements selected from the group consisting of Ta and Nb and 0.1 to 10 at % of Ag.

Preferably, the material powder is a powder of an alloy having a composition which is mainly composed of Al and contains 1 to 10 at % of one or two species of elements selected from the group consisting of Ta and Nb and 0.1 to 10 at % of Ag.

Preferably, the optical medium in accordance with the present invention further comprises a recording layer having at least two reaction layers on the reflective layer, while a constituent element of one reaction layer and a constituent element of the other reaction layer are mixable with each other by irradiation with a laser beam for writing.

Specifically, it will be preferred in particular if the optical medium further comprises a recording layer having a first reaction layer mainly composed of one element selected from the group consisting of Cu, Al, Zn, and Ag and a second reaction layer mainly composed of one element selected from the group consisting of Si, Ge, and Sn.

Preferably, the optical medium further comprises a dielectric layer between the reflective layer and the recording layer, and $66<nd<76$, where n [-] is the refractive index of the dielectric layer, and d [nm] is the thickness of the dielectric layer.

In this specification, "mainly composed of" refers to the component having the largest atomic ratio, while at % refers to atomic percent.

The present invention provides an inexpensive sputtering target for optical media which is mainly composed of relatively inexpensive aluminum and excellent in surface smoothness, a method of manufacturing the same, an optical medium, and a method of manufacturing the same.

BRIEF DESCRIPTION OF THE DRAWINGS

FIG. 4 is a graph illustrating frequency characteristics of noise levels in optical discs in accordance with Examples 1 and 3 and Comparative Example 1.

DESCRIPTION OF THE PREFERRED EMBODIMENTS

Figure 1:
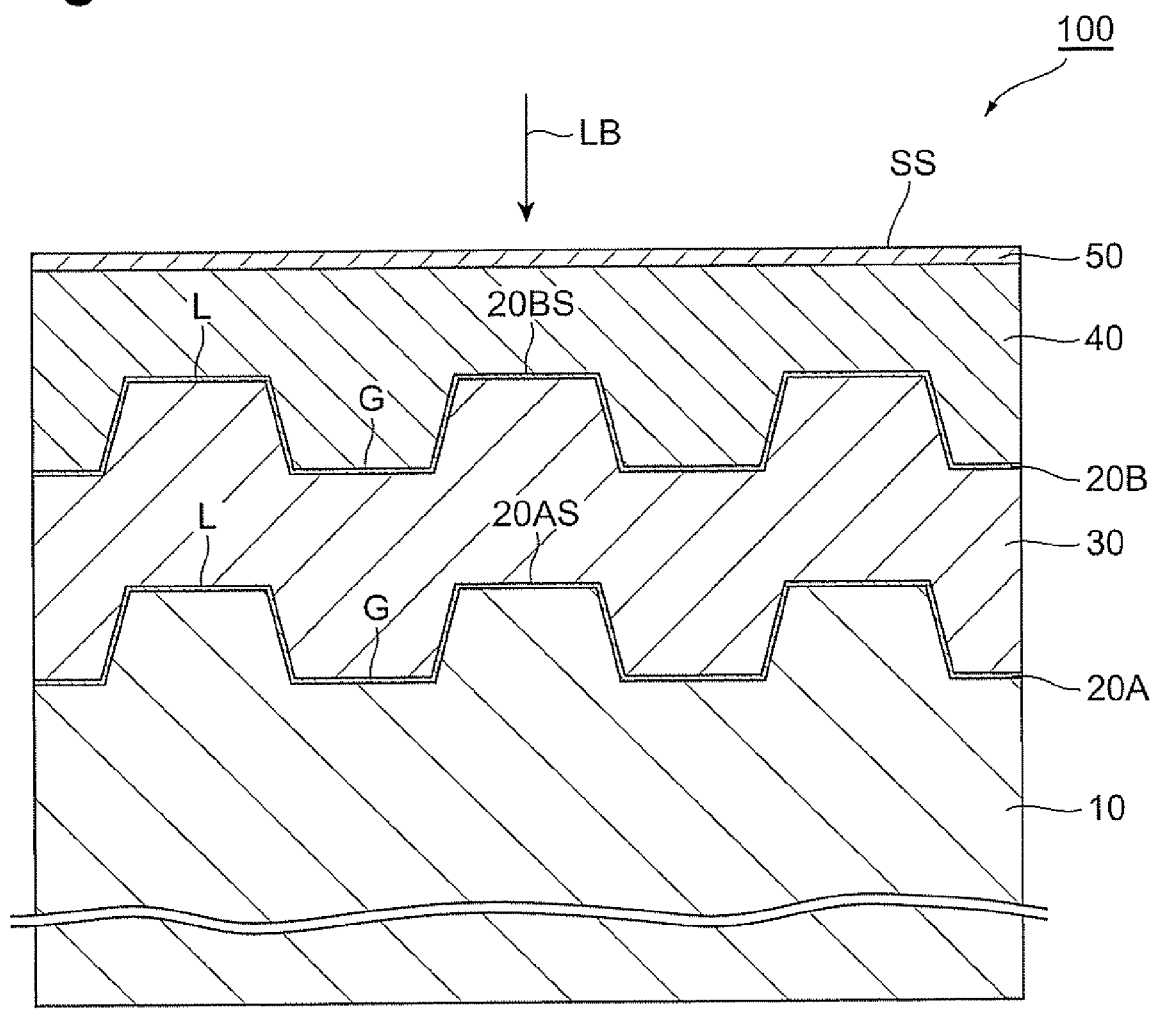
FIG. 1 is a sectional view of an optical disc 100 in accordance with an embodiment.

In the following, preferred embodiments of the present invention will be explained in detail with reference to the accompanying drawings. In the explanation of the drawings, the same or equivalent constituents will be referred to with the same signs while omitting their overlapping descriptions.

Sputtering Target for Optical Media

The sputtering target for optical media in accordance with an embodiment has a composition which is mainly composed of Al and contains 1 to 10 at % of one or two species of elements selected from the group consisting of Ta and Nb and 0.1 to 10 at % of Ag.

From the viewpoint of surface smoothness in particular, the composition preferably contains 5 to 10 at %, more preferably 5 to 7 at %, of one or two species of elements selected from the group consisting of Ta and Nb.

Preferably, from the viewpoint of surface smoothness, the composition contains 1 to 8 at % of Ag.

The target preferably contains only Al as an element component other than Ta, Nb, Ag, and inevitable impurities, but may contain other elements.

Though the smoothness of the reflective layer does not vary much in particular among the cases where Ta is contained without Nb, where Nb is contained without Ta, and where both Nb and Ta are contained, Nb is less expensive than Ta, so that it will be preferred if Nb is contained more than Ta, and it will be more preferred if Nb is contained without Ta. Since Ta has a thermal conductivity higher than that of Nb, adjusting the compounding ratio between Nb and Ta can control the thermal conductivity when necessary.

The target is not restricted in particular in terms of fowl, size, and the like, and may be a disc having a diameter of about 127 to 300 mm, for example.

Though the mode of metal structure in the target is not limited in particular, the atomized structure described in Japanese Patent No. 3545787 is effective in the manufacturing stage.

Method of Manufacturing Sputtering Target for Optical Media

An example of methods of manufacturing the above-mentioned sputtering target for optical media will now be explained.

A material powder satisfying the above-mentioned element composition is prepared. For example, a mixture of different kinds of metal powders in which powders of Al, Ag, Ta, Nb, TaNb, and the like are mixed such as to satisfy the above-mentioned composition can be used as the material powder. An alloy powder such as an atomized AlNbAg alloy powder, for example, which is formed by once melting a mixture of metal powders mixed such as to attain the above-mentioned element composition and then atomizing thus obtained alloy into a powder as in the manufacturing method described in Japanese Patent No. 3545787 may also be used alone as a material powder.

Preferably, the material powder has a particle size of 320 meshes or less, which is not limited in particular, and a purity of 99.9 wt % or higher.

Preferably, dry mixing is used for mixing the material powder.

Subsequently, the material powder is fired under a high temperature and a high pressure in vacuum or an inert gas atmosphere. In an example of the firing condition, the pressure is 100 to 500 kgf/cm$^2$, while the temperature is 400 to 800° C. Productivity becomes more stable when an alloy powder is fired alone than when a mixture of different kinds of metal powders is fired.

Thus obtained sintered body is then processed by cutting into a predetermined size and so on, whereby a sputtering target is completed.

The sputtering target of the present invention can also be manufactured without using the sintering method. For example, the above-mentioned material powder may be molten in vacuum or an inert gas atmosphere, cooled, and then forged or extended as necessary, so as to manufacture the sputtering target.

Optical Disc 100

A method of manufacturing an optical disc 100 as an example of optical media manufactured by using the sputtering target for optical media will now be explained.

The optical disc 100 illustrated in FIG. 1 is a so-called BD-ROM, which is a read-only optical disc incapable of writing, shaped like a disc having an outer diameter of about 120 mm and a thickness of about 1.2 mm, for example, comprising a support substrate (substrate) 10, a reflective layer 20A, an intermediate layer 30, a reflective layer 20B, a transparent cover layer 40, and a topcoat layer 50. The optical disc 100 in accordance with this embodiment is an optical disc which allows data to be reproduced or read as necessary when a laser beam LB having a wavelength $\lambda$ of 380 to 450 nm, preferably about 405 nm, is made incident thereon from the topcoat layer 50 side on the side opposite from the support substrate 10.

The support substrate 10 is a disc-shaped substrate used for securing a thickness (of about 1.2 mm) required for the optical disc 100. On its one surface, grooves G and lands L for guiding the laser beam LB and serving as bases for irregularities for recording are formed spirally from near a center part thereof to an outer edge part. Various materials can be used as a material for the support substrate 10. For example, any of glass, ceramics, and resins can be used. Among them, the resins are preferred from the viewpoint of easiness in shaping. Examples of such resins include polycarbonate resins, olefin resins, acrylic resins, epoxy resins, polystyrene resins, polyethylene resins, polypropylene resins, silicone resins, fluorine-based resins, ABS resins, and urethane resins. Among them, polycarbonate resins and olefin resins are preferred in particular in view of their workability and the like.

The reflective layer 20A acts to reflect the laser beam LB made incident on a light incident surface SS which is the front face of the topcoat layer 50, so as to make it exit from the light incident surface SS, while rapidly dissipating the heat caused by the laser beam LB. This enhances the optical reflectance with respect to the laser beam LB and thus can improve reproducing characteristics. The reflective layer 20A has a composition corresponding to that of the above-mentioned sputtering target.

The thickness of the reflective layer 20A is preferably set to 5 to 300 nm, 20 to 200 nm in particular. When the thickness of the reflective layer 20A is less than 5 nm, the surface smoothness of the film-deposition end surface (S) cannot fully be attained. When the thickness of the reflective layer 20A exceeds 300 nm, on the other hand, not only the surface smoothness of the film-deposition end surface (S) decreases, but also the film-deposition time becomes longer, thereby lowering the productivity. Setting the thickness of the reflective layer 20A to 5 to 300 nm, 20 to 200 nm in particular, can achieve sufficient surface smoothness and prevent the productivity from decreasing.

The intermediate layer 30 is a layer transparent to the laser beam LB. Though not restricted in particular, examples of the material for the intermediate layer include resin materials, UV-cured resins in particular. The thickness of the intermediate layer 30 is preferably about 20 to 30 μm on average. Grooves G and lands L are also formed on the intermediate layer 30 as on the support substrate 10.

The reflective layer 20B is a film similar to the reflective layer 20A. The reflective layer 20B is required to transmit therethrough a part of the laser beam LB and thus is preferably thinner than the reflective layer 20A.

Since the optical disc 100 in accordance with this embodiment is an optical disc of a next generation type in which films are successively formed from the side opposite from the light incident surface SS, surfaces 20AS, 20BS of the reflective layers 20A, 20B on the light incident surface SS side tend to become rougher than those in optical discs such as CD and DVD in which films are successively formed from the light incident surface side. The following is a reason therefor. In optical discs such as CD and DVD in which films are successively formed from the light incident surface side, the film-deposition start surface in the surfaces of each reflective layer is located on the light incident surface side. Therefore, its surface property substantially coincides with that of the base. In optical discs of a next generation type in which films are successively formed from the side opposite from the light incident surface SS as in the optical disc 100 in accordance with this embodiment, by contrast, the surfaces 20AS, 20BS to become the film-deposition end surfaces in the surfaces of the reflective layers 20A, 20B are located on the light incident surface SS side. Therefore, their surface property is lowered by crystal growth and the like in the process of forming the films. Hence, as a material for the reflective layers 20A, 20B, it is necessary to select a material which is excellent in the surface smoothness on the film-deposition end surfaces 20AS, 20BS while being mainly composed of relatively inexpensive aluminum and capable of reducing the amount of rare-earth metals in order to save cost. It is also desirable that the content of expensive silver be as small as possible. The reflective layers 20A, 20B formed by sputtering with the sputtering target having the above-mentioned composition satisfy these requirements. The reflective layers 20A, 20B exhibit sufficiently high reflectance with respect to laser beams whose wavelength $\lambda$ falls within the range of 380 to 450 nm and have appropriate thermal conductivity, thereby yielding optical reflectance sufficient for the laser beam LB and being able to rapidly dissipate the heat caused by the laser beam LB.

The transparent cover layer 40 is a layer transparent to the laser beam LB. Examples of materials for the transparent cover layer 40 include resin materials such as UV-cured acrylic resins. The thickness of this layer is about 50 to 100 µm, for example.

The topcoat layer 50 is used for protecting the front face of the optical disc 100. Examples of materials usable for the topcoat layer 50 include UV-cured acrylic resins.

Optical Disc 200

Figure 2:
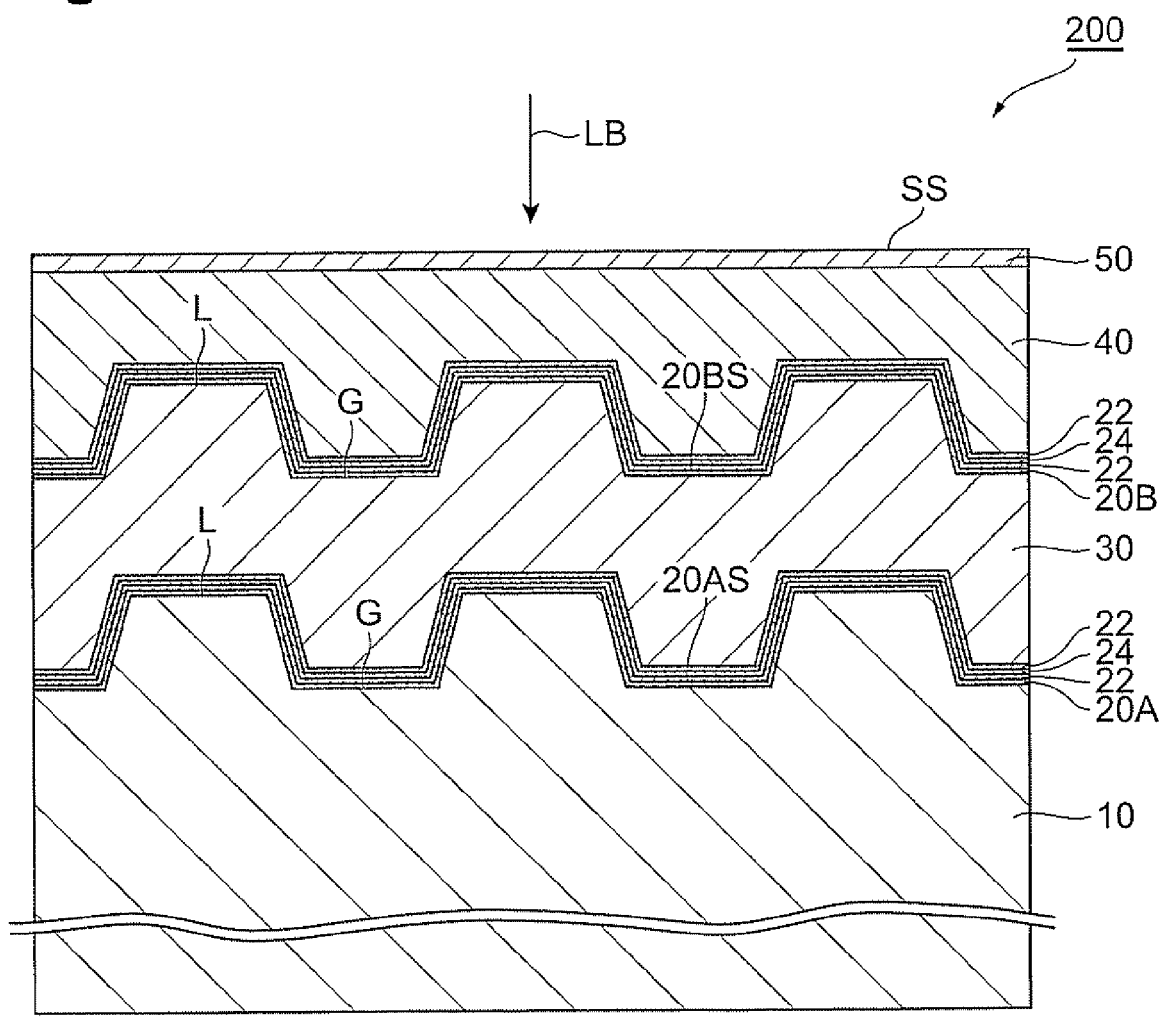
FIG. 2 is a sectional view of an optical disc 200 in accordance with an embodiment.

A second optical disc 200 will be explained with reference to FIG. 2. Only differences from the first optical disc 100 will be explained here.

The second optical disc 200 is a writable disc which is known as BD-R or BD-RE, for example. A protective layer 22, a recording layer 24, and a protective layer 22 are provided between the reflective layer 20A and intermediate layer 30, while a protective layer 22, a recording layer 24, and a protective layer 22 are also provided between the reflective layer 20B and transparent cover layer 40.

The protective layers 22 act to physically and/or chemically protect the recording layer 24 provided therebetween. By being held between the protective layers 22, the recording layer 24 can effectively be prevented from deteriorating recorded information over a long period after optical recording. For example, a transparent dielectric can be used as a constituent material for the protective layers 22. The protective layers 22 also act to enhance the difference between optical characteristics before and after the recording. For easily achieving this role, it is preferable to use a material having high refractive index (n) in the wavelength region of the laser beam LB in use, i.e., the wavelength range of 380 to 450 nm, at a wavelength of about 405 nm in particular. Since the recording sensitivity becomes lower as the energy absorbed by the protective layers 22 is greater at the time of irradiation with the laser beam LB, it is preferable to select a material having a low extinction coefficient (k) in the wavelength range of 380 to 450 nm, at a wavelength of about 405 nm in particular, for preventing this. Though the protective layers 24 are arranged on both sides of the recording layer 24, they may be omitted from one or both sides.

Examples of materials usable for the protective layers 22 include oxides, nitrides, a sulfide, a carbide, a fluoride, and their mixtures.

Usable as the oxides are those of tantalum (Ta), aluminum (Al), silicon (Si), titanium (Ti), germanium (Ge), niobium (Nb), tin (Sn), zinc (Zn), cerium (Ce), yttrium (Y), and lanthanum (La), i.e., $Ta_2O_5$, $Al_2O_3$, $SiO_2$, $TiO_2$, $GeO_2$, $Nb_2O_5$, $SnO_2$, $ZnO$, $CeO_2$, $Y_2O_3$, and $La_2O_3$. Usable as the nitrides are those of aluminum (Al), silicon (Si), and germanium (Ge), i.e., AlN, $Si_3N_4$, and GeN. Usable as the sulfide is that of zinc (Zn), i.e., ZnS. Usable as the carbide is that of silicon (Si), i.e., SiC. Usable as the fluoride is that of magnesium (Mg), i.e., $MgF_2$. Examples of their mixtures include SiAlON (a mixture of $SiO_2$, $Al_2O_3$, $Si_3N_4$, and AlN) and LaSiON (a mixture of $La_2O_3$, $SiO_2$, and $Si_3N_4$).

A pair of protective layers 22, 22 holding the recording layer 24 therebetween may be constituted by the same material or different materials. At least one of the pair of protective layers 22, 22 may have a multilayer structure constituted by a plurality of dielectric layers.

Though not restricted in particular, the thickness of each protective layer 22 is preferably 3 to 200 nm in view of the fact that the laser beam in use has a wavelength in the blue wavelength region of 380 to 450 nm.

For the recording layer 24, which is a layer in which recording marks can be formed, various layers such as those of inorganic and organic types can be employed. Examples of the inorganic type include single-layer films of metals and alloys and multilayer films in which a plurality of metal or alloy layers are laminated (e.g., a multilayer structure composed of an Si layer and a copper alloy layer). Examples of the organic type include organic dye layers such as those made of an azo dye.

When the laser beam LB for recording is focused at the recording layer 24, its heat causes a phase change, melting, mixing, diffusion, decomposition, or the like, thereby forming a recording mark. Here, the reflectance with respect to the reproducing laser beam LB varies greatly between the recording mark part and the other part (blank region) in the recording layer, which can be utilized for recording and reproducing data.

Though not restricted in particular, the thickness of the recording layer 24 is preferably set to 2 to 40 nm, for example, more preferably 2 to 20 nm, further preferably 2 to 15 nm.

Such optical disc 200 yields operations and effects similar to those of the optical disc 100.

Figure 3:
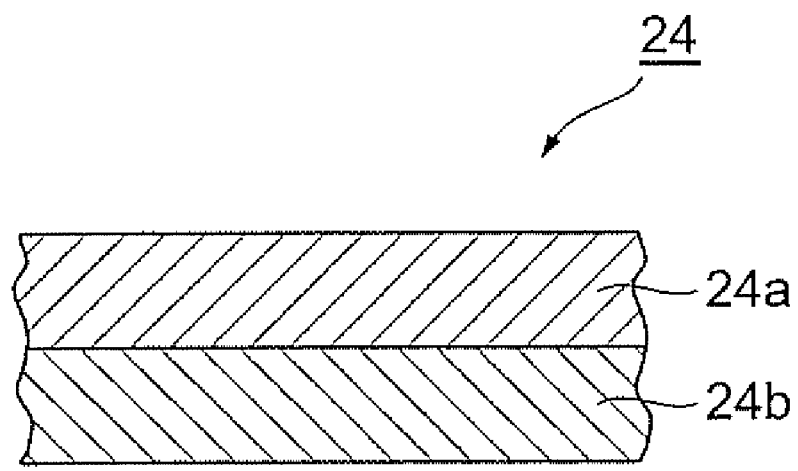
FIG. 3 is a sectional view of an example of recording layers of a recordable type.

It will be preferred in particular in the present invention if the optical disc 200 is the so-called recordable optical disc (e.g., BD-R) in which recording marks are irreversibly formed in the recording layer 24. In this case, the recording layer 24 is provided with a multilayer structure including at least two reaction layers 24a, 24b as illustrated in FIG. 3. A plurality of reaction layers 24a, 24b and the like are in a laminated state in a region which is in an unrecorded state in the recording layer 24. When this region is irradiated with a laser beam for writing having a predetermined power or higher, its resulting heat partly or totally mixes the respective elements constituting the reaction layers, thereby forming a recording mark. Here, the reflectance with respect to the laser beam varies greatly between the part formed with the recording mark and the other part (blank region), which can be utilized for recording and reproducing data. That is, upon irradiation with the laser beam for writing, a constituent element of one reaction layer and a constituent element of the other reaction layer can be mixed with each other.

Examples of materials for use in such a reaction layer include inorganic materials such as alloys and metals. Specific examples include those mainly composed of one material selected from the group consisting of aluminum (Al), silicon (Si), germanium (Ge), carbon (C), tin (Sn), gold (Au), zinc (Zn), copper (Cu), boron (B), magnesium (Mg), titanium (Ti), manganese (Mn), iron (Fe), gallium (Ga), zirconium (Zr), silver (Ag), bismuth (Bi), and platinum (Pt); in this case, it will be preferred if the other reaction layer is mainly composed of another material selected from the above-mentioned group. Especially, in order to further suppress the noise level of the reproduced signal, it will be preferred if the one reaction layer is mainly composed of one element selected from the group consisting of Cu, Al, Zn, and Ag and the other reaction layer is mainly composed of one element selected from the group consisting of Si, Ge, and Sn. The order of laminating the reaction layers is not limited in particular.

Preferably, the reaction layers 24a, 24b and the like are in contact with each other. The number of reaction layers may be 3 or more.

The thicker the recording layer 24, the worse the roughness of the surface to be irradiated with a beam spot of a laser beam, and thereby the noise level in reproduced signals is increased and the recording sensitivity is lowered. When the recording layer 24 is too thin, on the other hand, the difference in reflectance between before and after recording becomes smaller, thereby making it impossible to attain a high-level reproduced signal (C/N ratio) at the time of reproducing. In view of this point, the thickness of the recording layer 24 is preferably set to 2 to 40 nm, more preferably 2 to 20 nm, further preferably 2 to 15 nm as mentioned above.

Though the respective thicknesses of the reaction layers are not limited in particular, their thickness ratio (reaction layer 24a/reaction layer 24b) is preferably about 1.0.

Preferably, in such recordable optical disc 200, dielectric layers (hereinafter referred to as dielectric layers 22, 22) are used as a pair of protective layers 22, 22 holding the recording layer 24 therebetween.

The pair of dielectric layers 22, 22 also act to enhance the difference between optical characteristics before and after recording. For easily achieving this, it is preferable to use a material having high refractive index (n) in the wavelength region of the laser beam in use, i.e., the wavelength range of 380 to 450 nm, at a wavelength of about 405 nm in particular. Since the recording sensitivity becomes lower as the energy absorbed by the pair of dielectric layers 22, 22 is greater upon irradiation with a laser beam, it is preferable to use a material having low absorption coefficient (k) in the wavelength range of 380 to 450 nm, at a wavelength of about 405 nm in particular, in order to prevent this.

Materials for the dielectric layers 22 are not limited in particular, whereby various materials for protective layers explained in the first optical disc can be used. It will be preferred in particular in this embodiment if an oxide alone or a mixture of a sulfide and an oxide is used as a material for the pair of dielectric layers 22, 22. Examples of the oxide include $ZnO$ and $SiO_2$. An example of the sulfide is $ZnS$.

Though not restricted in particular, the thickness of each of the pair of dielectric layers 22, 22 is preferably 3 to 200 nm in view of the fact that the laser beam in use has a wavelength in the blue wavelength region of 380 to 450 nm. When the thickness is less than 3 nm, it is harder to attain the effects of protecting the recording layer 24 and enhancing the difference between optical characteristics before and after recording. When the thickness exceeds 200 nm, on the other hand, the film-deposition time becomes longer, thereby lowering the productivity.

When the dielectric layer 22 is provided between each of the reflective layers 20A, 20B and the recordable recording layer 24, it will be preferred in particular if $66 < nd < 76$, where n [–] is the refractive index of the dielectric layer 22 at the wavelength of the laser beam, and d [nm] is the thickness of the dielectric layer 22. This is effective in lowering jitter while allowing the reflectance of the optical disc 200 to fall within a specified range.

The principle of recording data onto such recordable optical disc 200 will now be explained with reference to FIG. 2. When recording data onto such optical disc 200, the recording layer 24 is irradiated with the intensity-modulated laser beam LB incident on the optical disc 200 from the light-transmitting layer side such as the topcoat layer 50.

Here, the numerical aperture (NA) of an objective lens for converging the laser beam LB and the wavelength λ of the laser beam LB are typically set to at least 0.7 and 380 to 450 nm, preferably about 0.85 and about 405 nm, respectively. Thus, $(\lambda/NA) < 640$ nm is typically set.

Irradiating the recording layer 24 with such laser beam LB heats the recording layer 24, thereby mixing respective elements constituting the plurality of reaction layers 24a, 24b. Thus mixed part becomes a recording mark, which exhibits a reflectance value different from that of the other part (blank region), whereby data can be recorded and reproduced by utilizing this.

Such optical disc 200 is a recordable optical recording medium of a next generation type in which films are formed successively from the support substrate 10 side, i.e., the side opposite from the light incident surface SS. Since the material for the reflective layers 20A, 20B is mainly composed of aluminum (Al), high optical reflectance and thermal conductivity can be obtained. Since a material having additives added to aluminum such as to yield the above-mentioned predetermined composition is used, favorable surface smoothness can be obtained in the film-deposition end surfaces, while being relatively inexpensive, thus making it possible to lower the noise level and so on.

Though each of the above-mentioned optical discs 100, 200 is of a so-called double-layer recording type having two reflective layers 20A, 20B, they may be of a single-layer recording type having only one reflective layer or a multilayer recording type having three or more reflective layers.

These optical discs can be manufactured by known methods except for forming the reflective layers 20A, 20B by using the above-mentioned sputtering target. The sputtering method is not limited in particular. A preferred sputtering scheme is a DC sputtering method.

The present invention can be modified in various ways without being restricted to the above-mentioned embodiments. For example, though the above-mentioned embodiments set forth BD as an example of the optical medium, optical discs other than BD may also be employed. Though optical discs shaped like a circular plate are exemplified in the above-mentioned embodiments, the optical medium is not restricted in particular in terms of two-dimensional forms and may be an optical card having a rectangular form.

EXAMPLES

Examples 1 to 7 and Comparative Examples 1 to 5

Respective powders of Al, Ag, Ta, Nb, and Cr each having a size of 320 meshes or less and a purity of 99.9 mass % were weighed so as to yield compositions listed in Table 1 and mixed in a dry fashion, whereby respective mixed powders of examples and comparative examples were obtained. Then, the mixed powders were fired in vacuum. They were fired under a pressure of 200 kgf/cm$^2$, while a temperature profile was formed by rapid heating to 720° C. in 30 min, holding at 720° C. for 30 min, cooling to 660° C., holding at 660° C. for 30 min, and slow cooling to room temperature in sequence.

The resulting sintered bodies were each shaped by a lathe into a diameter of 200 mm and a thickness of 8 mm, whereby respective sputtering targets were obtained.

Using each sputtering target, a reflective layer having a thickness of 80 nm was formed by DC magnetron sputtering on a support substrate made of polycarbonate having a thickness of 1.1 mm and a diameter of 120 mm and including a ROM signal; then a transparent cover layer was formed thereon by an acrylic UV-curable resin, so as to yield a single-layer BD-ROM.

Each of the BD-ROMs obtained by the examples and comparative examples was set to an optical disc evaluation system (product name: DDU-1000 manufactured by Pulstec Industrial Co., Ltd.) and irradiated with a laser beam having a wavelength of 405 nm through an objective lens having a numerical aperture of 0.85 while being rotated at a linear velocity of 5.3 msec, whereby noise components at 4.2 MHz and other frequencies included in reflected light were measured. Here, the noise component at 4.2 MHz corresponds to a signal component of an 8T signal at the above-mentioned linear velocity. Also, the surface roughness Ra in an area of 2 μm$^2$ of the reflective film was measured by AFM in a mirror surface part of the disc before forming the transparent cover.

Table 1 lists the results. FIG. 4 illustrates frequency characteristics of noise levels in the optical discs in accordance with Examples 1 and 3 and Comparative Example 1.

The reflective layers made by the target of the present invention were seen to be able to exhibit favorable noise characteristics while keeping a low cost.

The jitter measured in each example after being stored for 1000 hr in an 80° C., 80% RH environment was 7.0% or less and favorable.

Examples 11 to 17 and Comparative Examples 11 to 15

First, a support substrate made of polycarbonate having a thickness of 1.1 mm and a diameter of 120 mm was set to a sputtering system. A reflective layer (having a thickness of 80 nm) made of a material mainly composed of aluminum (Al) and doped with 6 at % of tantalum (Ta) and 5 at % of silver (Ag), a dielectric layer (having a thickness of 30 nm) made of a mixture of ZnS and SiO$_2$ (at a molar ratio of 80:20), a reaction layer 24b (having a thickness of 6 nm) mainly composed of copper (Cu) and doped with 23 at % of aluminum (Al), a reaction layer 24a (having a thickness of 5 nm) made of silicon (Si), and a dielectric layer (having a thickness of 20 nm) made of a mixture of ZnS and SiO$_2$ (at a molar ratio of 80:20) were successively formed by sputtering on the support substrate.

Next, an acrylic UV-curable resin was applied onto the dielectric layer by spin-coating and then was irradiated with UV rays, so as to form a transparent cover layer (having a thickness of 100 μm), thereby making a BD-R type optical medium of Example 11.

Optical media of Examples 12 to 17 and Comparative Examples 11 to 15 were made as in Example 11 except for changing the composition of the reflective layer as listed in Table 2. Optical media of Examples 18 to 20 were made as in Example 17 except for changing the thickness of the dielectric layer as listed in Table 2. Optical media of Examples 21 to 24 were made as in Example 17 except for using ZnO as the material for the dielectric layer and changing the thickness of the dielectric layer as listed in Table 2.

Evaluation of Samples

Subsequently, each of the optical media was set to an optical disc evaluation system (product name: DDU-1000 manufactured by Pulstec Industrial Co., Ltd.) and irradiated with a laser beam having a wavelength of 405 nm through an

TABLE 1

| | Ta [at %] | Nb [at %] | Ag [at %] | Cr [at %] | Al [at %] | Surface roughness [nm] | Noise characteristic [dB] |
|---|---|---|---|---|---|---|---|
| Example 1 | 6 | — | 5 | — | remainder | 0.2-0.3 | −70~−68 |
| Example 2 | — | 6 | 0.3 | — | remainder | 0.3-0.4 | −70~−68 |
| Example 3 | — | 6 | 5 | — | remainder | 0.2-0.3 | −70~−68 |
| Example 4 | — | 8 | 1 | — | remainder | 0.3-0.4 | −70~−68 |
| Example 5 | 3 | 3 | 8 | — | remainder | 0.2-0.3 | −70~−68 |
| Example 6 | 2 | — | 5 | — | remainder | 0.4-0.5 | −70~−68 |
| Example 7 | — | 6 | 2 | — | remainder | 0.2-0.3 | −70~−68 |
| Comparative Example 1 | — | 6 | — | — | remainder | 0.6-1.0 | −68~−65 |
| Comparative Example 2 | — | 12 | 1 | — | remainder | 0.5-0.8 | −68~−65 |
| Comparative Example 3 | — | 6 | 12 | — | remainder | 0.4-0.5 | −68~−65 |
| Comparative Example 4 | — | — | 8 | — | remainder | 0.6-1.0 | −68~−65 |
| Comparative Example 5 | — | — | — | 5 | remainder | 0.7-1.2 | −68~−65 | objective lens having a numerical aperture of 0.85 while being rotated at a linear velocity of 19.68 msec, so as to carry out recording in practice. The recording signal was a mixed signal in a 1.7 RLL modulation scheme, while a condition yielding the lowest jitter was used as the recording condition. Here, the jitter refers to clock jitter, which was calculated as σ/Tw, where σ was the fluctuation in a reproduced signal determined by a time interval analyzer, while Tw was one period of a clock. Noise levels were determined as in Example 1. Also, the surface roughness Ra in an area of 2 μm² of the reflective film was measured by AFM in a mirror surface part of the disc before forming the dielectric layer and recording layer. Table 2 lists the results. It was seen that the surface smoothness and noise characteristics became excellent when the composition of the reflected film fell within a predetermined range. It was also seen that a favorable jitter characteristic was obtained while keeping the reflectance of the optical medium within a specified range when 66<nd<76.

3. The optical medium according to claim 2, further comprising a recording layer having at least two reaction layers on the reflective layer, wherein a constituent element of one reaction layer and a constituent element of the other reaction layer are mixable with each other by irradiation with a laser beam for writing.

4. The optical medium according to claim 2, further comprising a recording layer having a first reaction layer mainly composed of one element selected from the group consisting of Cu, Al, Zn, and Ag and a second reaction layer mainly composed of one element selected from the group consisting of Si, Ge, and Sn.

5. The optical medium according to claim 3, further comprising a dielectric layer between the reflective layer and the recording layer, and 66<nd<76, where n [-] is the refractive index of the dielectric layer, and d [nm] is the thickness of the dielectric layer.

TABLE 2

| | Reflective layer | | | | | Refractive index of dielectric layer n [—] | Thickness of dielectric layer d [nm] | nd [nm] | Surface roughness [nm] | Noise characteristic [dB] | Jitter (%) | Reflectance (%) |
| | Ta (at %) | Nb (at %) | Ag (at %) | Mg (at %) | Al (at %) | Dielectric layer | | | | | | | |
|---|---|---|---|---|---|---|---|---|---|---|---|---|---|
| Example 11 | 6 | — | 5 | — | remainder | ZnS(80 mol %) + SiO$_2$(20 mol %) | 2.3 | 30 | 69 | 0.2-0.3 | −70~−68 | 6.3 | 18.1 |
| Example 12 | — | 6 | 0.3 | — | remainder | ZnS(80 mol %) + SiO$_2$(20 mol %) | 2.3 | 30 | 69 | 0.3-0.4 | −70~−68 | 6.3 | 17.8 |
| Example 13 | — | 6 | 5 | — | remainder | ZnS(80 mol %) + SiO$_2$(20 mol %) | 2.3 | 30 | 69 | 0.2-0.3 | −70~−68 | 6.3 | 17.8 |
| Example 14 | — | 8 | 1 | — | remainder | ZnS(80 mol %) + SiO$_2$(20 mol %) | 2.3 | 30 | 69 | 0.3-0.4 | −70~−68 | 6.3 | 17.8 |
| Example 15 | 3 | 3 | 8 | — | remainder | ZnS(80 mol %) + SiO$_2$(20 mol %) | 2.3 | 30 | 69 | 0.2-0.3 | −70~−68 | 6.3 | 18.1 |
| Example 16 | 3 | — | 5 | — | remainder | ZnS(80 mol %) + SiO$_2$(20 mol %) | 2.3 | 30 | 69 | 0.4-0.5 | −70~−68 | 6.3 | 18.1 |
| Example 17 | — | 6 | 2 | — | remainder | ZnS(80 mol %) + SiO$_2$(20 mol %) | 2.3 | 30 | 69 | 0.2-0.3 | −70~−68 | 6.3 | 17.8 |
| Example 18 | — | 6 | 2 | — | remainder | ZnS(80 mol %) + SiO$_2$(20 mol %) | 2.3 | 27 | 62 | 0.2-0.3 | −70~−68 | 6.8 | 15.2 |
| Example 19 | — | 6 | 2 | — | remainder | ZnS(80 mol %) + SiO$_2$(20 mol %) | 2.3 | 32 | 74 | 0.2-0.3 | −70~−68 | 6.5 | 22.4 |
| Example 20 | — | 6 | 2 | — | remainder | ZnS(80 mol %) + SiO$_2$(20 mol %) | 2.3 | 34 | 78 | 0.2-0.3 | −70~−68 | 6.8 | 23.9 |
| Example 21 | — | 6 | 2 | — | remainder | ZnO | 2.1 | 30 | 63 | 0.2-0.3 | −70~−68 | 6.9 | 14.3 |
| Example 22 | — | 6 | 2 | — | remainder | ZnO | 2.1 | 33 | 69 | 0.2-0.3 | −70~−68 | 6.5 | 16.5 |
| Example 23 | — | 6 | 2 | — | remainder | ZnO | 2.1 | 35 | 74 | 0.2-0.3 | −70~−68 | 6.7 | 20.8 |
| Example 24 | — | 6 | 2 | — | remainder | ZnO | 2.1 | 37 | 78 | 0.2-0.3 | −70~−68 | 6.9 | 23.9 |
| Comparative Example 11 | — | 6 | — | — | remainder | ZnS(80 mol %) + SiO$_2$(20 mol %) | 2.3 | 30 | 69 | 0.6-1.0 | −68~−65 | 7.1 | 15.1 |
| Comparative Example 12 | — | 12 | 1 | — | remainder | ZnS(80 mol %) + SiO$_2$(20 mol %) | 2.3 | 30 | 69 | 0.5-0.8 | −68~−65 | 7.1 | 17.8 |
| Comparative Example 13 | — | 6 | 12 | — | remainder | ZnS(80 mol %) + SiO$_2$(20 mol %) | 2.3 | 30 | 69 | 0.4-0.5 | −68~−65 | 7.1 | 17.8 |
| Comparative Example 14 | — | — | 8 | — | remainder | ZnS(80 mol %) + SiO$_2$(20 mol %) | 2.3 | 30 | 69 | 0.6-1.0 | −68~−65 | 7.2 | 18.2 |
| Comparative Example 15 | — | — | — | 15 | remainder | ZnS(80 mol %) + SiO$_2$(20 mol %) | 2.3 | 30 | 69 | 0.7-1.1 | −68~−65 | 7.5 | 17.1 |

What is claimed is:

1. A sputtering target for optical media, the sputtering target being mainly composed of Al and containing 1 to 10 at % of one or two species of elements selected from the group consisting of Ta and Nb and 0.1 to 10 at % of Ag.

2. An optical medium comprising:
a substrate; and
a reflective layer provided on the substrate, the reflective layer being mainly composed of Al and containing 1 to 10 at % of one or two species of elements selected from the group consisting of Ta and Nb and 0.1 to 10 at % of Ag.

6. The optical medium according to claim 2, wherein the medium is irradiated with a laser beam for reading or writing from a film-deposition end surface side of the reflective layer.

7. A method of manufacturing an optical medium, the method comprising a step of forming a reflective layer by using a sputtering target being mainly composed of Al and containing 1 to 10 at % of one or two species of elements selected from the group consisting of Ta and Nb and 0.1 to 10 at % of Ag.

8. A method of manufacturing a sputtering target for optical media, the method comprising a step of firing a material powder having a composition, mainly composed of Al, containing 1 to 10 at % of one or two species of elements selected from the group consisting of Ta and Nb and 0.1 to 10 at % of Ag.

9. The method of manufacturing a sputtering target for optical media according to claim 8, wherein the material powder is a powder of an alloy, mainly composed of Al, containing 1 to 10 at % of one or two species of elements selected from the group consisting of Ta and Nb and 0.1 to 10 at % of Ag.

* * * * *